Patented Feb. 20, 1951 2,542,727

UNITED STATES PATENT OFFICE 2,542,727

ETCHING PROCESSES AND SOLUTIONS

Henry C. Theuerer, New York, N. Y., assignor to Bell Telephone Laboratories, Incorporated, New York, N. Y., a corporation of New York No Drawing. Application December 29, 1949, Serial No. 135,817

7 Claims. (Cl. 41—42)

This invention relates to methods of preparing the surfaces of germanium bodies for use in the formation of translating devices and to etching fluids for use in these methods.

There has recently been developed a new type of semiconductor triode amplifier, which has come to be known as the transistor, which is made up of a body of germanium to which three connections are made, one connection making a broad area contact with the germanium and the other two connections each making point contact with the germanium at closely spaced points. If a signal current is passed in one direction across the germanium body through one of the point contacts and the broad area contact and a potential is applied in the opposite direction across the broad area contact and the other point contact, the signal is amplified through the latter path. In such a device, the most desirable amplification characteristics are obtained only if the germanium surface is given a suitable preparatory treatment.

This treatment involves cutting a body, as for instance a wafer, from an ingot of germanium, grinding the surface to a dull gray finish with a suitable wet abrasive powder, washing and drying the surface, and then etching the surface in a suitable etchant solution until the dull, lustreless gray appearance has been replaced by a surface having a sharply delineated grain structure and a metallic lustre on the grain surfaces. The two point contact wires are then applied to the treated surface, the broad area base contact having been applied to the germanium body at any time after it was cut from the ingot. The device is then subjected to an electrical "forming" operation to develop the desired characteristics. This preliminary treatment is more particularly described and claimed in the application of W. G. Pfann, Serial No. 67,797, filed December 29, 1948.

The nature of the etchant solution used in this treatment has a considerable effect upon the characteristics of the finished device. Prior to the present invention, an etchant which gave satisfactory results was an aqueous solution of nitric acid, hydrofluoric acid and copper nitrate.

The present invention is based upon the discovery that superior transistor characteristics, as well as increased ease of manufacture, are produced if the etching operation referred to above is carried out using an etchant which is an aqueous solution of hydrofluoric acid and hydrogen peroxide.

The etching process of the present invention is effective when applied to surfaces of all bodies of germanium of the types used in point contact rectifiers, whether n-type or p-type germanium. The nature of the germanium used for forming rectifiers is well known in the art and forms no part of the present invention. The dependence of germanium type upon the presence of small amounts of impurities is set forth in the literature, on pages 64 and 65 of "Crystal Rectifiers" by Torrey and Whitmer, volume 15 of Massachusetts Institute of Technology Radiation Laboratory Series (McGraw-Hill, New York, 1948).

Transistors of the type referred to above are most conveniently formed from germanium having the shape of a disc or wafer. The wafer may be cut from an ingot of n-type or p-type germanium. N-type germanium, ordinarily containing an excess of donor atoms of the order of several parts in 10,000,000, has been found particularly suitable. It is convenient to mount the germanium wafer on a stud, as of brass, by a suitable means, as by soldering one face of the wafer to a face of the stud, so as to provide the broad area contact referred to above.

The exposed face of the germanium wafer is then ground. The grinding is most suitably carried out by grinding the germanium surface against a smooth hard surface, as of glass, charged with a slurry of water and an abrasive, such as alundum, which is a pure crystalline aluminum oxide, having a fine particle size of the order of 600 mesh (passing a screen of 600 mesh per inch). Obviously, a coarser or finer abrasive may be used, for instance with a particle size of 200 mesh, or larger, to 900 mesh or finer. The germanium surface is then washed with water and dried, after which it has a dull, gray, lustreless appearance.

The germanium surface is then etched in the aqueous solution of hydrofluoric acid and hydrogen peroxide referred to above. If the germanium wafer is mounted on a brass stud, no precautions are necessary to protect the stud during the etching operation since this etchant has only a mild action on the metal of the stud. The germanium wafer can therefore be etched by direct immersion, together with the stud, in the etching solution. With etchants previously used, it was necessary to protect the mounting stud during the etching, which was a costly and time consuming operation.

The solution of hydrofluoric acid and hydrogen peroxide can be used effectively for etching germanium in a considerable range of proportions and dilutions. Convenient commercial sources of the ingredients of the etching solution are an aqueous hydrofluoric acid solution containing 48 per cent by weight of hydrogen fluoride and an aqueous solution of hydrogen peroxide containing 30 per cent by weight of hydrogen peroxide.

A very satisfactory etching solution for the purpose of the present invention is made up of 1 part by volume of such a hydrofluoric acid solution, 1 part by volume of such a hydrogen peroxide solution and 4 additional parts by volume of water. The hydrogen fluoride concentration in such a solution is about 95 grams per liter. With such an etching solution, the desired transistor properties can be obtained by etching the germanium surface for one minute. The resulting germanium surface has a sharply delineated grain structure and a metallic lustre within the grain boundaries. Etching for a longer period of time results in continuous dissolution of germanium from the surface but has no substantial effect on the transistor properties. Therefore, etching may be continued for as long as desired, short of actual mechanical damage to the germanium wafer, but in commercial practice it is desirable, for economic reasons, that the etching period be as short as possible.

In the etching solution referred to above, equal volumes of a 48 per cent hydrofluoric acid solution and a 30 per cent hydrogen peroxide solution were used (a ratio of 1.7 parts by weight of hydrofluoric acid to 1 part of hydrogen peroxide), and the mixture was diluted with water. A similar mixture, undiluted with additional water, can also be used satisfactorily. The etching action of the undiluted mixture is so great that the resulting germanium surface is pitted but this has no detrimenal effect on the transistor properties. It is, however, ordinarily more desirable to use a more dilute solution which offers greater control over the etching rate.

As the solution is made more dilute, the rate of etching decreases so that a longer immersion time is necessary to produce the characteristic etched surface appearance and the desired transistor characteristics. Thus with a solution made up of 1 volume of 48 per cent aqueous hydrofluoric acid, 1 volume of 30 per cent aqueous hydrogen peroxide and 128 volumes of additional water, about one hour was required for complete etching. Since longer etching times are impractical from an economic standpoint, solutions more dilute than this are ordinarily not desirable, although obviously they can be used where the slow etching rate is not objectionable.

In general, the ratio by weight of hydrogen fluoride to hydrogen peroxide in the etching solution should be not greater than 3 to 1, since with smaller proportions of hydrogen peroxide an undesirable green film is formed on the germanium surface. The ratio of hydrogen fluoride to hydrogen peroxide may be as low as 1 to 10 or even 1 to 25. With an etching solution containing 5 volumes of 48 per cent aqueous hydrogen fluoride and 40 volumes of 30 per cent hydrogen peroxide (a weight ratio of hydrogen fluoride to hydrogen peroxide of about 1 to 5), diluted with 40 volumes of additional water, a satisfactory etch was obtained in 2 minutes.

The permissible dilution of the etching solution can, in general, be measured in terms of the concentration of the hydrogen fluoride in the solution. Solutions containing less than 3 grams of hydrogen fluoride per liter of solution have such a slow etching action as to be of little practical value and it is, therefore, desirable to use solutions having at least this concentration. Preferably concentrations of at least 35 grams of hydrogen fluoride per liter of solution are used in order to gain the advantages of more rapid etching.

Concentrations of hydrogen fluoride in excess of 300 grams per liter of solution are undesirable because of the uncontrollably rapid etching rate. Preferably the concentration is maintained at not more than 150 grams, or more preferably 100 grams, per liter of solution.

Immediately after removal from the etching solution, the etched body is thoroughly washed and dried, as by washing it in a running stream of cold water and drying it in an air blast.

This treatment results in a germanium body which can be assembled into a transistor of superior amplifying properties. Such a transistor may be formed by applying two separate point contact electrodes to the prepared germanium surface. These electrodes may be of copper or phosphor bronze, although electrodes of silver, tungsten, molybdenum, aluminum, platinum and other materials have been used. The points of contact between the two electrodes and the germanium surface are spaced closely together, ordinarily at a distance of 0.001 inch to 0.006 inch from one another, although in some cases the distance may be less than 0.001 inch and as large as 0.020 inch or more. The diameters of the junctions between the point contact electrodes and the germanium surface may be of the order of 0.001 inch or less.

One of these point contact electrodes, referred to as the emitter, and the broad area base connection constitute the two input connections of the transistor. The other point contact electrode, referred to as the collector, and the broad area base connection constitute the two output connections of the transistor.

Prior to use, the transistor is subjected to an electrical forming operation. This forming is carried out by electrically connecting the emitter to the base, preferably with a positive bias, with respect to the base, of the order of 1 or several volts, and imposing a sufficient voltage, in the direction of difficult current flow between the collector and the base. Ordinarily forming takes place when the voltage in the collector circuit is sufficient to cause the current-voltage relationship to pass into a region of negative resistance. A high resistance, of the order of 5000 ohms or more, is maintained in the collector circuit during this forming operation in order to prevent excessive current flow when the region of negative resistance is reached.

Although a direct-current voltage may be applied in the collector circuit to cause forming, it is preferable that an alternating current source be used to supply, periodically, the required voltage in the direction of difficult current flow. A low voltage, of the order of 30 volts, may be applied initially and then gradually increased until the forming voltage in the region of negative resistance is reached, as discussed above. The current-voltage relationship between the collector and the base can be observed on a properly connected cathode-ray oscilloscope. This forming procedure is more particularly described and claimed in the application of W G Pfann, referred to above.

The formed transistor is ready for use as a triode amplifier. Two measures of transistor quality are the current multiplying factor (α)

and the power gain (G). The current multiplying factor is defined as:

$$\alpha=\frac{r_m+r_b}{r_c+r_b}$$

and the power gain is defined as:

$$G=\frac{\alpha^2}{4}\frac{r_c+r_b}{r_e+r_b}$$

where $r_m$, $r_b$, $r_c$ and $r_e$ are small measured values of signal impedance in an equivalent circuit analogue of the transistor, as defined more fully in the publication entitled "The Transistor, A New Semiconductor Amplifier," by J. A. Becker and J. N. Shive, published in Electrical Engineering, vol. 68, pp. 215 to 221 (March 1949).

In a series of tests, a group of transistors prepared as described above, using an etch of one minute in a solution of 1 volume of 48 per cent aqueous hydrofluoric acid, 1 volume of 30 per cent aqueous hydrogen peroxide and 4 volumes of additional water, gave an average current multiplying factor of about 2.1 and an average power gain of about 20 decibels.

A similar group of transistors was prepared in an identical manner except that an etch consisting of 10 cubic centimeters concentrated nitric acid, 5 cubic centimeters of 48 per cent aqueous hydrofluoric acid, 0.2 gram copper nitrate and 10 cubic centimeters of additional water, was used. The average current multiplying factor for this group was about 1.2 and the average power gain was about 15 decibels. Thus, in this comparison, the method of the present invention showed a 75 per cent better current multiplying factor and a 5 decibel, or 316 per cent, better power gain.

The description of the invention above is in terms of its specific embodiments and is intended to be illustrative of and not a limitation on the scope of the invention.

What is claimed is:

1. The process of preparing the surface of a body of germanium for use in a semiconductor translator which comprises etching said surface in an aqueous solution of hydrogen peroxide and hydrogen fluoride and then washing said etching fluid from said surface.

2. The process as described in claim 1 wherein the hydrogen fluoride is present in the solution in a concentration between about 3 grams and about 300 grams per liter of solution and the hydrogen peroxide is present in a concentration between about 1 part by weight per 3 parts of hydrogen fluoride and 25 parts by weight per part of hydrogen fluoride.

3. The process of preparing the surface of a body of germanium for use in a semiconductor translator which comprises abrading the surface of the germanium, etching said surface in an aqueous solution of hydrogen peroxide and hydrogen fluoride and then washing said etching fluid from said surface.

4. The process as described in claim 3 wherein the hydrogen fluoride is present in the solution in a concentration between about 35 grams and about 150 grams per liter of solution and the hydrogen peroxide is present in a concentration between about 1 part by weight per 3 parts of hydrogen fluoride and 5 parts by weight per part of hydrogen fluoride, and wherein the etching is continued until the surface possesses a metallic lustre.

5. The process as described in claim 4 wherein the proportions of ingredients in the solution are those produced by 1 volume of aqueous hydrofluoric acid containing 48 per cent hydrogen fluoride by weight, 1 volume of aqueous hydrogen peroxide containing 30 per cent hydrogen peroxide by weight and 4 volumes of additional water, and wherein the etching is continued for about 1 minute.

6. A solution for etching the surface of germanium bodies for use in semiconductor translators which solution is an aqueous solution of hydrogen fluoride and hydrogen peroxide in concentrations produced by dissolving 1 volume of aqueous hydrofluoric acid containing 48 per cent by weight of hydrogen fluoride and 1 volume of aqueous hydrogen peroxide containing 30 per cent hydrogen peroxide by weight in 4 volumes of additional water.

7. A solution for etching the surface of germanium bodies for use in semiconductor translators which solution is an aqueous solution of hydrogen fluoride and hydrogen peroxide in which the hydrogen fluoride is present in a concentration between about 35 grams and about 150 grams per liter of solution and the hydrogen peroxide is present in a concentration between about 1 part by weight per 3 parts of hydrogen fluoride and 5 parts by weight per part of hydrogen fluoride.

HENRY C. THEUERER.

REFERENCES CITED

The following references are of record in the file of this patent:

UNITED STATES PATENTS

| Number | Name | Date |
|---|---|---|
| 590,966 | Cornwall | Oct. 5, 1897 |
| 2,266,430 | Matthews | Dec. 16, 1941 |
| 2,337,062 | Page | Dec. 21, 1943 |
| 2,353,786 | Ross | July 18, 1944 |
| 2,462,218 | Olsen | Feb. 22, 1949 |